US012587168B2

(12) United States Patent
Yu et al.

(10) Patent No.: US 12,587,168 B2
(45) Date of Patent: Mar. 24, 2026

(54) SAW RESONATOR DESIGN METHOD, SAW FILTER AND DESIGN METHOD THEREFOR, AND COMPUTING DEVICE-READABLE RECORDING MEDIUM HAVING SAME RECORDED THEREON

(71) Applicant: WiPAM, Inc., Seongnam-si (KR)

(72) Inventors: Dae Kyu Yu, Seoul (KR); Kyoung Joon Min, Seongnam-si (KR); Kyung Oh Kim, Seoul (KR)

(73) Assignee: WiPAM, Inc., Seongnam-si (KR)

( * ) Notice: Subject to any disclaimer, the term of this patent is extended or adjusted under 35 U.S.C. 154(b) by 172 days.

(21) Appl. No.: 18/725,806

(22) PCT Filed: Dec. 15, 2022

(86) PCT No.: PCT/KR2022/020440
§ 371 (c)(1),
(2) Date: Jun. 30, 2024

(87) PCT Pub. No.: WO2023/128417
PCT Pub. Date: Jul. 6, 2023

(65) Prior Publication Data
US 2025/0070740 A1 Feb. 27, 2025

(30) Foreign Application Priority Data
Dec. 29, 2021 (KR) ........................ 10-2021-0190778

(51) Int. Cl.
*H03H 9/64* (2006.01)
*H03H 3/10* (2006.01)
(Continued)

(52) U.S. Cl.
CPC ................ *H03H 9/64* (2013.01); *H03H 3/10* (2013.01); *H03H 9/02992* (2013.01);
(Continued)

(58) Field of Classification Search
CPC ........ H03H 9/64; H03H 3/10; H03H 9/02992;
H03H 9/25; H03H 9/6406; H03H 9/6483;
H03H 9/145; H03H 9/14541
(Continued)

(56) References Cited

U.S. PATENT DOCUMENTS 10,284,176 B1 * 5/2019 Solal ........................ H03H 3/08
2003/0030511 A1 2/2003 Nakamura et al.
(Continued)

FOREIGN PATENT DOCUMENTS

JP 2001-308671 A 11/2001
JP 2003-198317 A 7/2003
(Continued)

OTHER PUBLICATIONS

International Search Report for PCT/KR2022/020440 mailed Mar. 23, 2023 from Korean Intellectual Property Office.
(Continued)

*Primary Examiner* — Andrea Lindgren Baltzell
*Assistant Examiner* — Victor Cole
(74) *Attorney, Agent, or Firm* — Revolution IP, PLLC

(57) ABSTRACT

The present invention relates to a SAW resonator design method, a SAW filter and a design method therefor, and a computing device-readable recording medium having same recorded thereon, which may improve a quality factor of the SAW resonator by designing a structure, such as an input IDT finger, an output IDT finger, and an interval between fingers in an IDT electrode of the SAW resonator under optimal conditions without changing a material of the SAW resonator or changing a manufacturing process, and may obtain reduced insertion loss and improved frequency characteristics by configuring the SAW filter by using the SAW resonator described above.

1 Claim, 6 Drawing Sheets

(51) Int. Cl.
   *H03H 9/02*          (2006.01)
   *H03H 9/25*          (2006.01)
(52) U.S. Cl.
   CPC ............ *H03H 9/25* (2013.01); *H03H 9/6406*
                   (2013.01); *H03H 9/6483* (2013.01)
(58) Field of Classification Search
   USPC ........................... 333/193; 310/313 R, 313 B
   See application file for complete search history.

(56)                    References Cited

U.S. PATENT DOCUMENTS

| | | |
|---|---|---|
| 2003/0117240 A1 | 6/2003 | Inoue et al. |
| 2006/0186968 A1 | 8/2006 | Ito |
| 2011/0199160 A1* | 8/2011 | Yamanaka ......... H03H 9/02661 |
| | | 331/155 |
| 2017/0366167 A1* | 12/2017 | Nakagawa ............. H03H 9/725 |

FOREIGN PATENT DOCUMENTS

| | | |
|---|---|---|
| JP | 2021-500838 A | 1/2021 |
| KR | 10-2006-0120007 A | 11/2006 |
| KR | 10-0795873 B1 | 1/2008 |
| KR | 10-2014-0077463 A | 6/2014 |

OTHER PUBLICATIONS

Roh, Yong Rae, "Optimal Design of Ladder Type SAW Filters", The Journal of the Acoustical Society of Korea, Aug. 1998, vol. 18, No. 1, pp. 16-24.

* cited by examiner

SAW RESONATOR DESIGN METHOD, SAW FILTER AND DESIGN METHOD THEREFOR, AND COMPUTING DEVICE-READABLE RECORDING MEDIUM HAVING SAME RECORDED THEREON

TECHNICAL FIELD

The present invention relates to a resonator or a band-pass filter used in mobile communication devices and the like, and more particularly to a surface acoustic wave resonator (hereinafter referred to as a "SAW resonator") or a surface acoustic wave filter (hereinafter referred to as a "SAW filter") capable of converting an electrical signal into a surface acoustic wave (SAW) of a piezoelectric material using the piezoelectric effect of the piezoelectric material and converting the converted surface acoustic wave (SAW) back into an electrical signal.

BACKGROUND ART

Since mobile devices, such as smartphones and tablet computers, require small RF filters, an acoustic filter using a surface acoustic wave (SAW) or a bulk acoustic wave (BAW), which has a much slower propagation speed than an EM wave, is mainly used.

With development of mobile communication systems, available frequency bands below 3 GHz are currently saturated. Therefore, radio frequency (RF) filters operating at frequency bands below 3 GHz require high selectivity, low insertion loss, and small size.

The filter that satisfies all of these requirements and is currently most widely used is a filter using a surface acoustic wave. In order to improve selectivity and to reduce the insertion loss of the SAW filter, it is necessary to improve the quality factor (Q-factor) of a SAW resonator constituting the filter.

Since the SAW filter is designed such that a plurality of one-port or two-port SAW resonators is connected in series or in parallel, the quality factor (Q value) of the one-port or two-port SAW resonator must be fundamentally improved in order to improve the quality factor (Q value) of the SAW filter.

Conventionally, improvement of the quality factor of the SAW resonator has been achieved by changing a piezoelectric material of a piezoelectric substrate constituting the SAW resonator, changing the crystal orientation of the piezoelectric material, or changing the process.

However, if the piezoelectric material of the piezoelectric substrate, the crystal orientation of the piezoelectric material, or the process is changed in order to improve the quality factor of the SAW resonator, the price of the SAW resonator is increased.

PRIOR ART DOCUMENTS

Japanese Patent Application Publication No. 2021-500838
Korean Patent Application Publication No. 2014-0077463
Korean Patent Application Publication No. 2006-0120007

DISCLOSURE

Technical Problem

It is an object of the present invention to provide a SAW resonator design method capable of modulating a surface acoustic wave (SAW) generated by an IDT electrode of a SAW resonator by changing the structure of the IDT electrode of the SAW resonator without changing the material of the SAW resonator or changing the manufacturing process such that the SAW resonator has the optimal quality factor that can be realized, a SAW filter, a method of designing the same, and a computing device-readable recording medium having the same recorded thereon.

Technical Solution

A SAW resonator design method according to an embodiment of the present invention, which is a method of designing a SAW resonator including a piezoelectric substrate and an IDT electrode provided on the piezoelectric substrate, the IDT electrode being configured to perform conversion between an electrical signal and a surface acoustic wave, the IDT electrode including a plurality of input IDT fingers and a plurality of output IDT fingers, wherein an input spacing portion is formed between one input IDT finger and one output IDT finger and an output spacing portion is formed between the output IDT finger and the next input IDT finger, includes defining each of an input finger metallization, which is the percentage of the input IDT finger in a region including the input IDT finger and the input spacing portion, and an output finger metallization, which is the percentage of the output IDT finger in a region including the output IDT finger and the output spacing portion, as a parameter and changing a set value of each of the input finger metallization and the output finger metallization to find a set value that satisfies a range of the quality factor of the selected SAW resonator.

The step of defining each of the input finger metallization and the output finger metallization as the parameter may further include defining the period length, which is defined as half of the period from the input IDT finger to the output spacing portion, as a parameter together with the input finger metallization and the output finger metallization, and the step of satisfying the range of the quality factor may include finding a setting value of each of the period length, the input finger metallization, and the output finger metallization to satisfy the range of the quality factor of the SAW resonator.

Each of the input finger metallization and the output finger metallization may be set to a value selected within a range of 0.40 to 0.60.

Meanwhile, a SAW filter design method according to an embodiment of the present invention, which is a method of designing a SAW filter by connecting a plurality of SAW resonators, each of the plurality of SAW resonators including a piezoelectric substrate and an IDT electrode provided on the piezoelectric substrate, the IDT electrode being configured to perform conversion between an electrical signal and a surface acoustic wave, in series and in parallel, the IDT electrode including a plurality of input IDT fingers and a plurality of output IDT fingers, wherein an input spacing portion is formed between one input IDT finger and one output IDT finger and an output spacing portion is formed between the output IDT finger and the next input IDT finger, includes defining, in each of the series-connected and parallel-connected SAW resonators, each of an input finger metallization, which is the percentage of the input IDT finger in a region including the input IDT finger and the input spacing portion, and an output finger metallization, which is the percentage of the output IDT finger in a region including the output IDT finger and the output spacing portion, as a parameter and changing a set value of each of the input finger metallization and the output finger metallization to find a set value that satisfies a range of the quality factor of the selected SAW filter.

In each of the plurality of series-connected SAW resonators of the SAW filter, the input finger metallization may be set to a value selected within a range of 0.41 to 0.48, and the output finger metallization may be set to a value selected within a range of 0.52 to 0.59.

In each of the plurality of parallel-connected SAW resonators of the SAW filter, the input finger metallization may be set to a value selected within a range of 0.52 to 0.55, and the output finger metallization may be set to a value selected within a range of 0.48 to 0.55.

In addition, the present invention provides a computing device-readable recording medium having the SAW filter design method recorded thereon.

Meanwhile, a SAW filter according to an embodiment of the present invention is a SAW filter including a plurality of SAW resonators connected in series and in parallel, each of the plurality of SAW resonators including a piezoelectric substrate and an IDT electrode provided on the piezoelectric substrate, the IDT electrode being configured to perform conversion between an electrical signal and a surface acoustic wave, wherein each of the plurality of SAW resonators is configured such that the IDT electrode includes a plurality of input IDT fingers and a plurality of output IDT fingers, an input spacing portion being formed between one input IDT finger and one output IDT finger, an output spacing portion being formed between the output IDT finger and the next input IDT finger, in each of the plurality of series-connected SAW resonators, an input finger metallization, which is the percentage of the input IDT finger in a region including the input IDT finger and the input spacing portion, is configured to have a value of 0.41 to 0.48, and an output finger metallization, which is the percentage of the output IDT finger in a region including the output IDT finger and the output spacing portion, is configured to have a value of 0.52 to 0.59, and in each of the plurality of parallel-connected SAW resonators, the input finger metallization is configured to have a value of 0.52 to 0.55, and the output finger metallization is configured to have a value of 0.48 to 0.55.

Advantageous Effects

The SAW resonator design method, the SAW filter, the method of designing the same, and the computing device-readable recording medium having the same recorded thereon according to the present invention have the effect that the quality factor of the SAW resonator may be improved by designing the structures of the input IDT finger, the output IDT finger, and the spacing portion between fingers in the IDT electrode of the SAW resonator under optimal conditions without changing the material of the SAW resonator or changing the manufacturing process, and the SAW filter may be constituted using the SAW resonator, whereby it is possible to achieve low insertion loss and improved frequency characteristics.

BEST MODE

A SAW resonator design method, a SAW filter, a method of designing the same, and a computing device-readable recording medium having the same recorded thereon according to the present invention will now be described in detail with reference to the accompanying drawings.

First, the configuration of a SAW resonator according to an embodiment of the present invention and a method of designing the SAW resonator will be described with reference to FIGS. 1 and 2.

Figure 1:
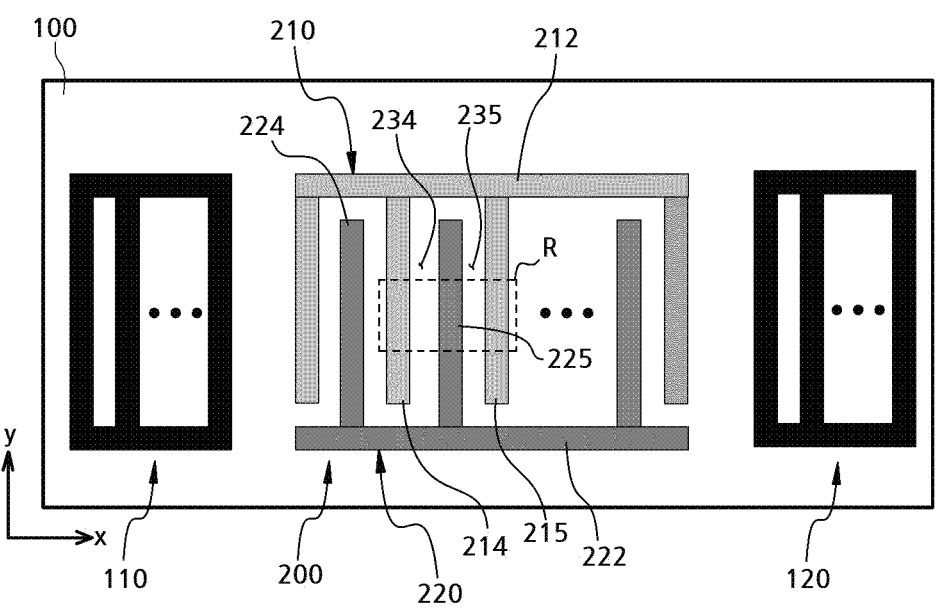
FIG. 1 is an x-y plan view showing the structure of a SAW resonator to illustrate a SAW resonator design method according to an embodiment of the present invention.
Figure 2:
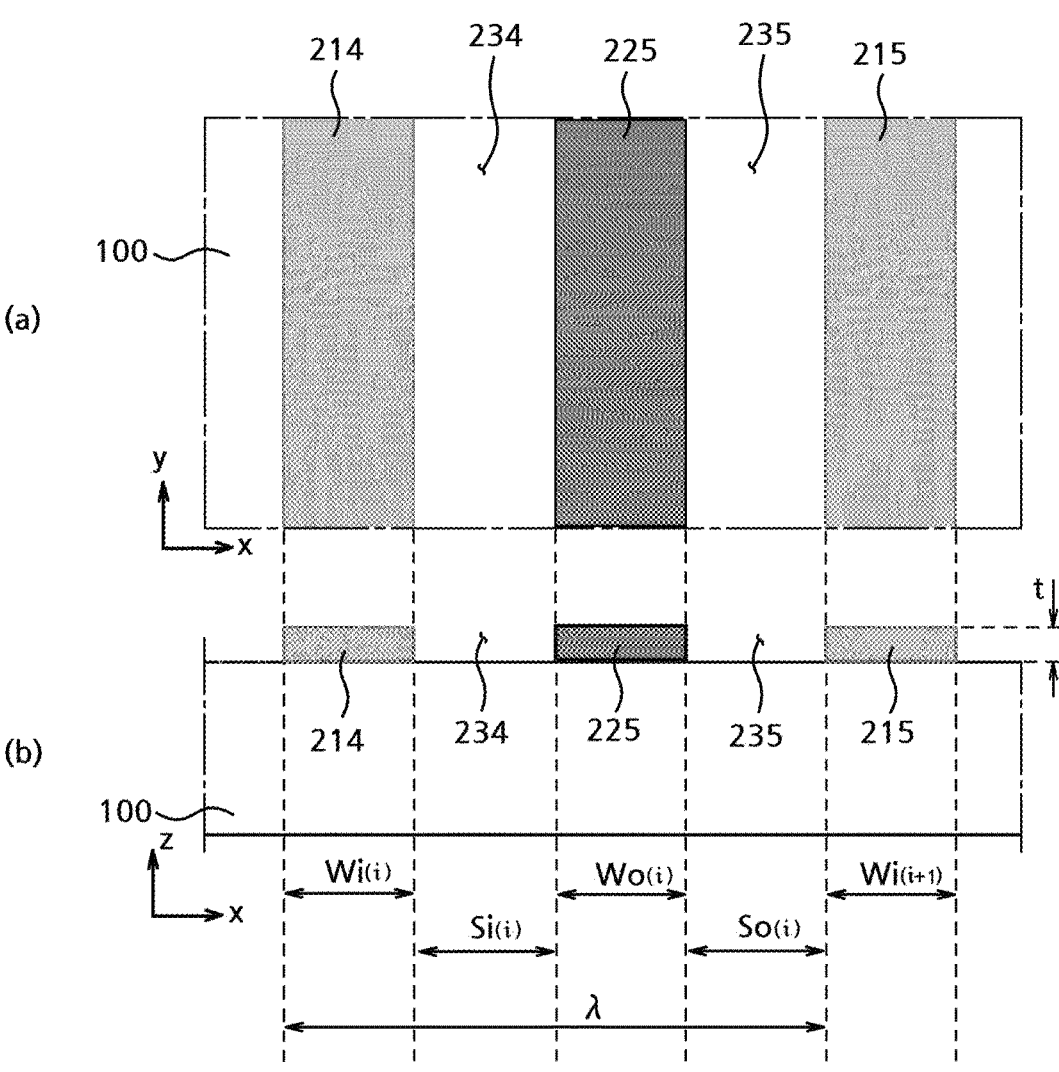
FIG. 2 illustrates an enlarged view (a) showing part R of FIG. 1, and a front view (b) (an x-z plan view) showing the part shown in the view (a).

FIG. 1 is an x-y plan view showing the structure of a SAW resonator to illustrate a SAW resonator design method according to an embodiment of the present invention, FIG. 2($a$) is an enlarged view showing part R of FIG. 1, and FIG. 2($b$) is a front view (an x-y plan view) showing the part shown in FIG. 2($a$).

As shown in FIG. 1, the SAW resonator may include a piezoelectric substrate 100 configured to convert electrical energy into acoustic energy by the piezoelectric effect, an IDT electrode 200 provided on the piezoelectric substrate 100 to generate a surface acoustic wave (SAW) on the piezoelectric substrate 100 according to an electrical signal or to convert the surface acoustic wave into an electrical signal, and reflectors 110 and 120 provided on both sides of the IDT electrode 200 to reflect the surface acoustic wave generated by the IDT electrode 200 to the IDT electrode 200.

In the SAW resonator, the surface acoustic wave generated by the IDT electrode is generated as the result of deformation of particles of a piezoelectric material of the piezoelectric substrate under the influence of an electric field generated by the IDT electrode, and has the relationship represented by [Equation 1] below.

$$S(r, t) = \frac{1}{2}(\nabla u(r, t) + \nabla u(r, t)) \equiv \nabla_s u(r, t) \nabla \cdot T(r, t) =$$ [Formula 1]

$$\rho \frac{\partial^2 u(r, t)}{\partial t^2} = \rho \frac{\partial v(r, t)}{\partial t}$$

where S indicates the stress, T indicates the strain, u indicates the particle displacement of the piezoelectric material, v indicates the particle velocity of the piezoelectric material, and ρ indicates the mass density. T and S satisfy [Equation 2] below.

$$T(r, t) = c:S(r, t) + \eta:\frac{\partial S(r, t)}{\partial t}$$ [Equation 2]

where c is the stiffness coefficient, and η is the viscosity coefficient. For a lossless medium with no body force, T and S may be represented by [Equation 3] below.

$$\frac{\partial T(r, t)}{\partial t} = c:\frac{\partial S(r, t)}{\partial t}$$ [Equation 3]

From [Equation 3] above, the velocity v of the surface acoustic wave generated by the IDT electrode may be represented by [Equation 4] below.

$$\nabla_s v(r, t) = s:\frac{\partial T(r, t)}{\partial t}$$ [Equation 4]

Therefore, when the strain T applied to the piezoelectric substrate, the velocity v of the surface acoustic wave when passing through the piezoelectric material, and the strain T applied to the output IDT finger from the surface acoustic wave generated by the IDT electrode are changed by changing the structure of the IDT electrode, i.e., by changing the width of an input IDT finger, the width of an output IDT finger, the width of an input spacing portion, and the width of an output spacing portion, the quality factor may be improved.

The IDT electrode 200 provided on the piezoelectric substrate 100 is made of metal, and as shown in FIG. 1, the IDT electrode 200 includes an input IDT electrode unit 210 and an output IDT electrode unit 220. The input IDT electrode unit 210 has a positive potential, and the output IDT electrode unit 220 has a negative potential.

The input IDT electrode unit 210 includes a plurality of input IDT fingers 214 and 215 and an input busbar 212 configured to electrically connect the input IDT fingers to each other, and the output IDT electrode unit 220 includes a plurality of output IDT fingers 224 and 225 and an output busbar 222 configured to electrically connect the output IDT fingers to each other.

In addition, the input IDT fingers 214 and 215 and the output IDT fingers 224 and 225 are alternately disposed one by one, and spacing portions 234 and 235 are formed between the input IDT fingers and the output IDT fingers so as to be spaced apart therefrom by a predetermined distance.

The spacing portions formed between the fingers are divided into an input spacing portion 234 and an output spacing portion 235, wherein the input spacing portion 234 is formed between the input IDT finger 214 and the output IDT finger 225 adjacent thereto, and the output spacing portion 235 is formed between the output IDT finger 225 and the next input IDT finger 215 adjacent thereto.

FIG. 2(*a*) is an enlarged view showing part R of FIG. 1, wherein a part of each of the i-th input IDT finger 214, the i-th input spacing portion 234, the i-th output IDT finger 225, and the (i+1)-th input IDT finger 215 is shown in an enlarged state.

While FIG. 2(*a*) shows part R of FIG. 1 in the x-y plane, FIG. 2(*b*) shows the part shown in FIG. 2(*a*) in the x-z plane so as to correspond thereto.

As shown in FIG. 2(*b*), the thicknesses t of the i-th input IDT finger 214, the i-th output IDT finger 225, and the (i+1)-th input IDT finger 215 are assumed to be the same, the i-th input spacing portion 234 is formed between the i-th input IDT finger 214 and the i-th output IDT finger 225, and the i-th output spacing portion 235 is formed between the i-th output IDT finger 225 and the (i+1)-th input IDT finger 215.

At this time, as shown in FIG. 2(*b*), the width of the i-th input IDT finger 214 is $Wi_{(i)}$, the width of the i-th output IDT finger 225 is $Wo_{(i)}$, and the width of the (i+1)-th input IDT finger 215 is $Wi_{(i+1)}$. In addition, the width of the input spacing portion 234 between the i-th input IDT finger 214 and the i-th output IDT finger 225 is $Si_{(i)}$, and the width of the output spacing portion 235 between the i-th output IDT finger 225 and the (i+1)-th input IDT finger 215 is $So_{(i)}$.

As shown in FIG. 2(*b*), the length from the end of the i-th input IDT finger 214 to the point where the i-th output spacing portion 235 and the (i+1)-th input IDT finger 215 are joined to each other in the x-direction is referred to as the period λ.

That is, the period λ of the IDT electrode may be defined as follows.

$$\lambda = Wi_{(i)} + Si_{(i)} + Wo_{(i)} + So_{(i)}$$ [Equation 5]

The method of designing the SAW resonator and the SAW filter according to the embodiment of the present invention is a method capable of improving the quality factor of the SAW resonator by designing the structures of the input IDT finger, the output IDT finger, the spacing portion between the fingers, etc. in the IDT electrode of the SAW resonator under optimal conditions without changing the material of the SAW resonator or changing the manufacturing process, and to this end, it is necessary to define some parameters regarding the structure of the IDT electrode.

As an important parameter in the method of designing the SAW resonator and the SAW filter according to the embodiment of the present invention, the period length Lp, which is half of the period λ of the IDT electrode, may be defined and used.

In addition, as important parameters, input finger metallization Mi, which is the proportion of the input IDT finger 214 in the region including the input IDT finger 214 and the input spacing portion 234, and output finger metallization Mo, which is the proportion of the output IDT finger 225 in the region including the output IDT finger 225 and the output spacing portion 235, may be defined and used.

That is, the input finger metallization Mi may be defined as the ratio of the area of the input IDT finger (metal) to the total area of the input IDT electrode, and the output finger metallization Mo may be defined as the ratio of the area of the output IDT finger (metal) to the total area of the output IDT electrode. Expressed mathematically, the i-th input finger metallization $Mi_{(i)}$ and the i-th output finger metallization $Mo_{(i)}$ may be represented by [Equation 6] below.

$$Mi_{(i)} = Wi_{(i)}/(Wi_{(i)} + Si_{(i)})$$ [Equation 6]

-continued $$Mo_{(i)} = Wo_{(i)}/(Wo_{(i)} + So_{(i)})$$

In the method of designing the SAW resonator and the SAW filter according to the embodiment of the present invention, the period length Lp, the input finger metallization Mi, and the output finger metallization Mo may be defined as parameters, the set value of each of the period length Lp, the input finger metallization Mi, output finger metallization Mo may be changed to find the set value that satisfies the range of the quality factor of the selected SAW resonator, and the parameters may be adjusted, whereby it is possible to design a SAW resonator having the optimal quality factor and a SAW filter using the same.

Figure 3:
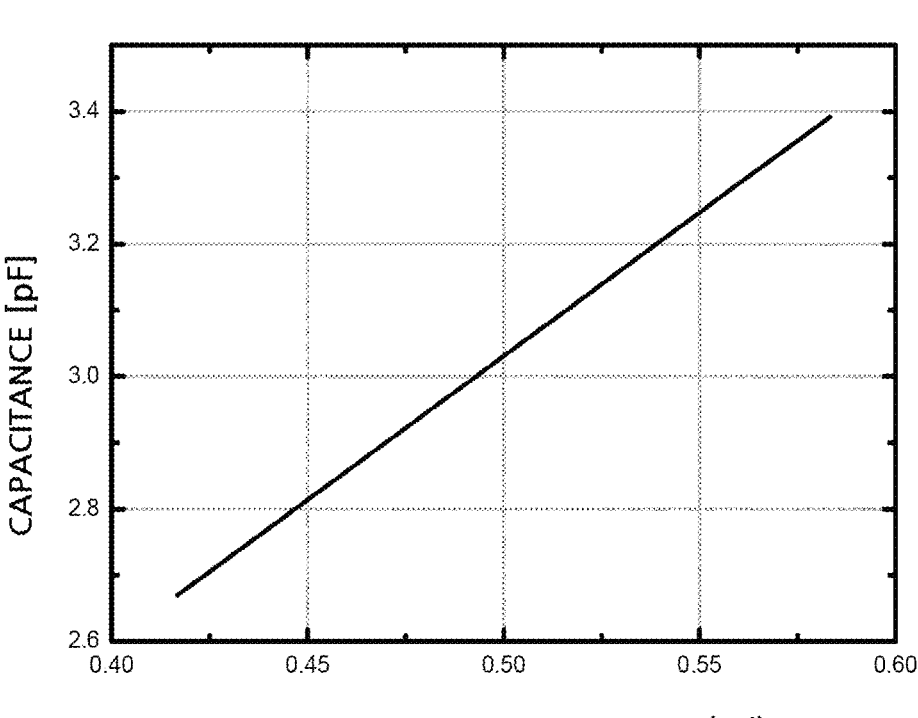
FIG. 3 is a graph showing the change of the capacitance of an IDT electrode in response to the change of input finger metallization Mi.

FIG. 3 is a graph showing the change of the capacitance of the IDT electrode in response to the change of the input finger metallization Mi.

As shown in FIG. 3, it can be seen that the capacitance of the IDT electrode of the SAW resonator changes proportionally as the input finger metallization Mi changes.

That is, FIG. 3 shows that, as the input finger metallization Mi changes within a range of 0.4 to 0.6, the capacitance of the IDT electrode changes in proportion thereto.

Figure 4:
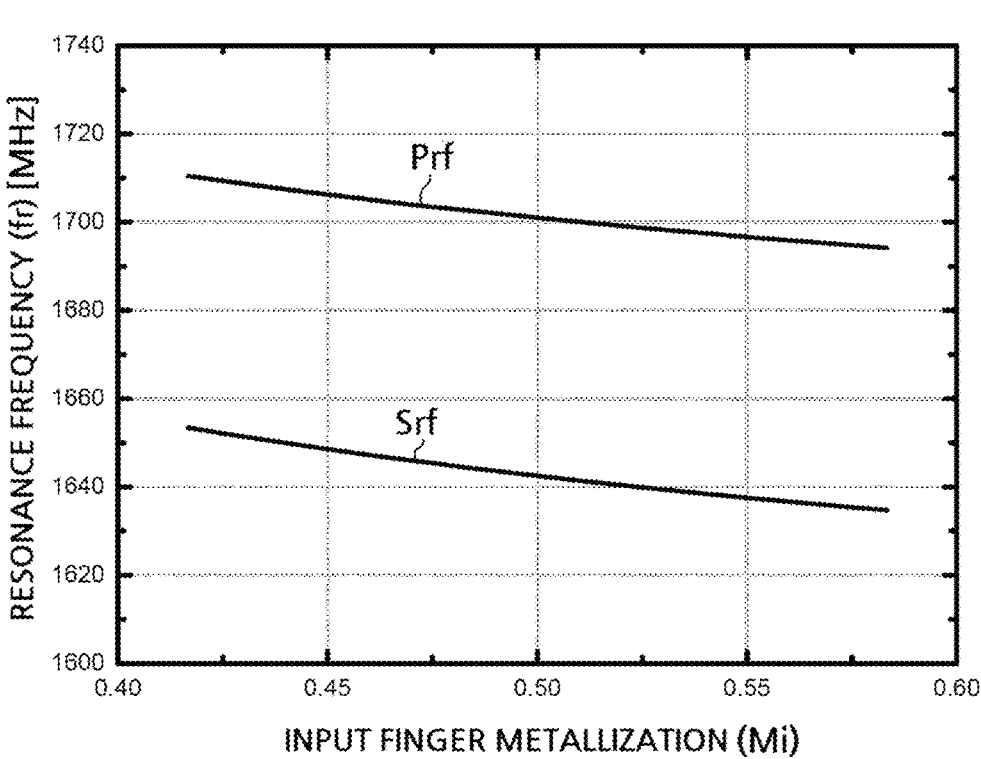
FIG. 4 is a view showing that the resonance frequency of an IDT electrode of a series-connected resonator of a SAW filter changes in the form of an Srf curve and the resonance frequency of an IDT electrode of a parallel-connected resonator of the SAW filter changes in the form of a Prf curve as input finger metallization changes.

When a plurality of SAW resonators having the same conditions as described above is connected in series and in parallel to form a SAW filter, it can be seen that the resonance frequency of the IDT electrode of the series-connected resonator of the SAW filter changes in the form of an Srf curve and the resonance frequency of the IDT electrode of the parallel-connected resonator of the SAW filter changes in the form of a Prf curve as the input finger metallization Mi changes, as shown in FIG. 4.

FIG. 4 shows that, when the value of each of the input finger metallization Mi and the output finger metallization Mo is changed from 0.4 to 0.6 under the condition that the input finger metallization and the output finger metallization have the same value, the resonance frequency of the series-connected SAW resonator changes in the form of an Srf curve and the resonance frequency of the parallel-connected SAW resonator changes in the form of a Prf curve.

As shown in FIG. 4, by properly selecting the combination of the input finger metallization and the output finger metallization, a plurality of SAW resonators having the combination may be connected in series and in parallel so as to have a desired series resonance frequency and a desired parallel resonance frequency in the configured SAW filter.

Here, the quality factor Q of the SAW resonator may be represented by [Equation 7] below.

$$Q(\omega) = \frac{\omega \tau_{gd}|S_{11}|}{1 - |S_{11}|^2} \qquad \text{[Equation 7]}$$

where $\omega$ indicates the angular frequency, and $\tau_{gd}$ is the group delay, which may be calculated as $$\tau_{gd} = -\frac{d\phi}{d\omega}.$$

S11 may be calculated from the scattering coefficient.

As shown in [Equation 7] above, since the quality factor $Q(\omega)$ is a function of the frequency $\omega$, and therefore when the combination of the input finger metallization and the output finger metallization in the SAW resonator is appropriately selected, it is possible to design a SAW filter having desired resonance frequency characteristics and to improve the quality factor, which is a function of the frequency.

That is, it is possible to find the combination of the input finger metallization and the output finger metallization that has the highest quality factor at a desired frequency in the SAW resonator, and therefore it is possible to design a SAW resonator and a SAW filter with improved quality factor.

Figure 5:
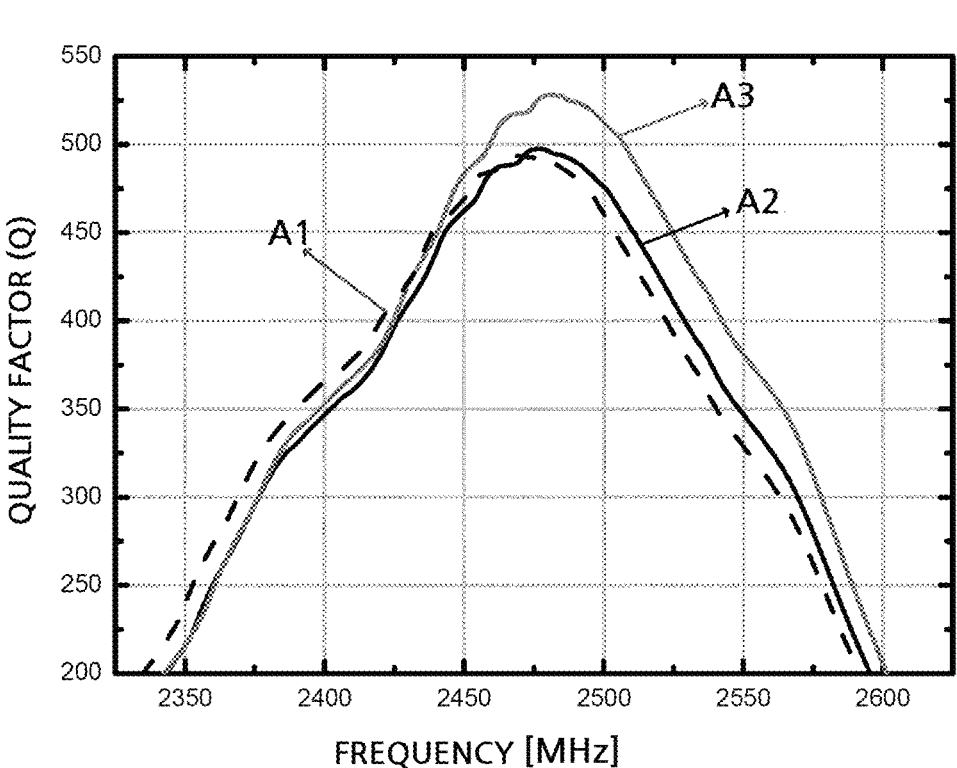
FIG. 5 is a view showing the change of the quality factor over a frequency range when the value of each of input finger metallization and output finger metallization is changed in the state in which the period length of the IDT electrode of the SAW resonator is not changed.

FIG. 5 shows the change of the quality factor Q over a frequency range when the value of each of the input finger metallization Mi and the output finger metallization Mo is changed in the state in which the period length Lp of the IDT electrode of the SAW resonator is not changed.

In FIG. 5, when the period length Lp of the IDT electrode of the SAW resonator is 0.8 μm, curve A1 is the curve when each of the input finger metallization and the output finger metallization is 0.525, curve A2 is the curve when each of the input finger metallization and the output finger metallization is 0.5, and curve A3 is the curve when each of the input finger metallization and the output finger metallization is 0.475.

As shown in FIG. 5, it can be seen that it is possible to improve the quality factor of the SAW resonator by changing the input finger metallization and the output finger metallization.

Figure 6:
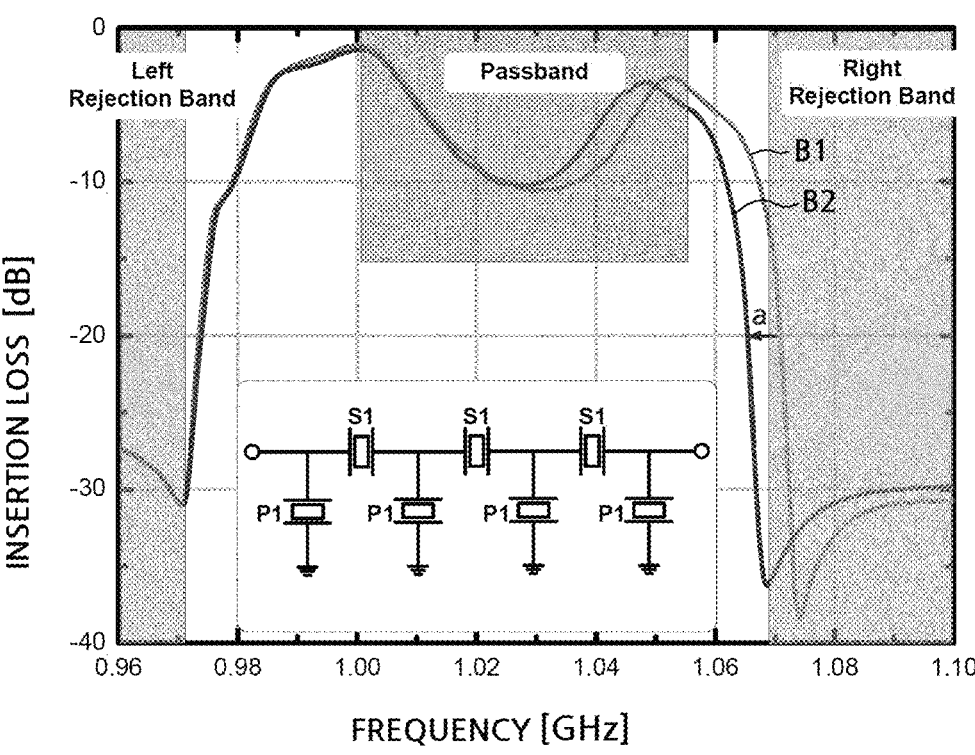
FIG. 6 is a graph showing the relationship between the frequency and the insertion loss in a SAW filter including a plurality of SAW resonators connected in series and in parallel when the value of each of input finger metallization of the series-connected SAW resonator S1 and input finger metallization of the parallel-connected SAW resonator P1 is changed.

FIG. 6 is a graph showing the relationship between the frequency and the insertion loss in a SAW filter including a plurality of SAW resonators connected in series and in parallel when the value of each of the input finger metallization of the series-connected SAW resonator S1 and the input finger metallization of the parallel-connected SAW resonator P1 is changed.

In FIG. 6, curve B1 is a graph showing the relationship between the frequency and the insertion loss of the SAW filter when the value of each of the input finger metallization of the series-connected SAW resonator S1 and the input finger metallization of the parallel-connected SAW resonator P1 is 0, and curve B2 is a graph showing the relationship between the frequency and the insertion loss of the SAW filter when the value of the input finger metallization of the series-connected SAW resonator S1 is 0.4730 and the value of the input finger metallization of the parallel-connected SAW resonator P1 is 0.55.

As shown in FIG. 6, it can be seen that, as the result of changing from curve B1 to curve B2 with the change of the value of the input finger metallization, the frequency period from the passband to the rejection is reduced by a, as shown in FIG. 6, and the insertion loss is more improved in the case of curve B2 than in the case of curve B1.

The SAW filter according to the embodiment of the present invention includes a plurality of SAW resonators connected in series and in parallel, wherein the input finger metallization of each of the plurality of series-connected SAW resonators has a value of 0.41 to 0.48, the output finger metallization of each of the plurality of series-connected SAW resonators has a value of 0.52 to 0.59, the input finger metallization of each of the plurality of parallel-connected SAW resonators has a value of 0.52 to 0.55 and the output finger metallization of each of the plurality of parallel-connected SAW resonators has a value of 0.48 to 0.55, whereby the quality factor of the SAW filter is further improved.

As described above, the SAW resonator design method, the SAW filter, and the method of designing the same according to the present invention are characterized in that the quality factor of the SAW resonator may be improved by designing the structures of the input IDT finger, the output IDT finger, and the spacing portion between the fingers in the IDT electrode of the SAW resonator under optimal conditions without changing the material of the SAW resonator or changing the manufacturing process, and the SAW filter may be constituted using the SAW resonator, whereby it is possible to achieve low insertion loss and improved frequency characteristics.

INDUSTRIAL APPLICABILITY

A SAW resonator design method, a SAW filter, a method of designing the same, and a computing device-readable recording medium having the same recorded thereon according to the present invention may be applied to software configured to perform functions by implementing a process according to the design method as an algorithm, to a computer configured to perform the functions, or to equipment for designing or manufacturing a SAW resonator or filter, and therefore the present invention has industrial applicability in the technical field of designing SAW resonators or SAW filters.

The invention claimed is:

1. A SAW filter comprising a plurality of SAW resonators connected in series and in parallel, each of the plurality of SAW resonators comprising a piezoelectric substrate and an IDT electrode provided on the piezoelectric substrate, the IDT electrode being configured to perform conversion between an electrical signal and a surface acoustic wave, wherein each of the plurality of SAW resonators is configured such that the IDT electrode comprises a plurality of input IDT fingers and a plurality of output IDT fingers, an input spacing portion being formed between one input IDT finger and one output IDT finger, an output spacing portion being formed between the output IDT finger and a next input IDT finger, in each of the plurality of series-connected SAW resonators, an input finger metallization, which is a percentage of the input IDT finger in a region comprising the input IDT finger and the input spacing portion, is configured to have a value of 0.41 to 0.48, and an output finger metallization, which is a percentage of the output IDT finger in a region comprising the output IDT finger and the output spacing portion, is configured to have a value of 0.52 to 0.59, and in each of the plurality of parallel-connected SAW resonators, the input finger metallization is configured to have a value of 0.52 to 0.55, and the output finger metallization is configured to have a value of 0.48 to 0.55.

* * * * *